US011747412B2

United States Patent
Naik et al.

(10) Patent No.: US 11,747,412 B2
(45) Date of Patent: Sep. 5, 2023

(54) MAGNETIC FIELD SENSOR USING MAGNETIC TUNNELING JUNCTION (MTJ) STRUCTURES AND PASSIVE RESISTORS

(71) Applicant: GLOBALFOUNDRIES Singapore Pte. Ltd., Singapore (SG)

(72) Inventors: Vinayak Bharat Naik, Singapore (SG); Eng Huat Toh, Singapore (SG); Kazutaka Yamane, Singapore (SG); Hemant M. Dixit, Halfmoon, NY (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 85 days.

(21) Appl. No.: 17/469,221

(22) Filed: Sep. 8, 2021

(65) Prior Publication Data
US 2023/0076514 A1 Mar. 9, 2023

(51) Int. Cl.
*G01R 33/09* (2006.01)
(52) U.S. Cl.
CPC .................. *G01R 33/098* (2013.01)
(58) Field of Classification Search
CPC .......... G01R 33/098; G01R 1/00; G01R 3/00; G01R 5/00; G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00; H01F 10/3254; H01F 10/3259; H01F 10/3286; H01F 41/34; H01L 27/22; H01L 43/02; H01L 43/12
See application file for complete search history.

(56) References Cited

U.S. PATENT DOCUMENTS

| 6,100,686 A | 8/2000 | Van Delden et al. |
| 2017/0212175 A1* | 7/2017 | Holm ................. G01R 33/0005 |
| 2021/0247470 A1* | 8/2021 | Zheng ................. H01F 10/3286 |

FOREIGN PATENT DOCUMENTS

| CN | 101278338 | 10/2008 |
| CN | 101589452 | 11/2009 |

OTHER PUBLICATIONS

Ferreira, R. et al., "2-Axis Magnetometers Based on Full Wheatstone Bridges Incorporating Magnetic Tunnel Junctions Connected in Series", IEEE Trans. on Magnetics, 2012, 48, 11, 4 pages.

(Continued)

*Primary Examiner* — Feba Pothen
*Assistant Examiner* — Brent J Andrews
(74) *Attorney, Agent, or Firm* — David Cain; Andrew M. Calderon; Calderon Safran & Cole, P.C.

(57) ABSTRACT

The present disclosure relates to integrated circuits, and, more particularly, to a magnetic field sensor using magnetic tunneling junction (MTJ) structures and passive resistors, and methods of manufacture and operation. The structure includes: a first portion of a circuit including a first MTJ structure and a first resistor coupled in series between a first voltage source and a second voltage source; and a second portion of the circuit including a second MTJ structure and a second resistor coupled in series between the first voltage source and the second voltage source. The first portion and the second portion are coupled in parallel between the first voltage source and the second voltage source.

13 Claims, 6 Drawing Sheets

(56) References Cited

OTHER PUBLICATIONS

Ogasawara, T. et al., "Effect of second-order magnetic anisotropy on nonlinearity of conductance in CoFeB/MgO/CoFeB magnetic tunnel junction for magnetic sensor devices", Scientific Reports, Nature, 2019, 9 pages.

Jeng, J. et al., "Vector Magnetometer with Dual-Bridge GMR Sensors", IEEE Trans. on Magnetics, 2014, 50,1, 2 pages.

Nakano, T. et al., "Magnetic Tunnel Junctions With [Co/Pd]-Based Reference Layer and CoFeB Sensing Layer for Magnetic Sensor", IEEE Trans. on Magnetics, 2016, 52, 7, 4 pages.

Franco, F. et al., "Reconfigurable Spintronics Wheatstone Bridge Sensors With Offset Voltage Compensation at Wafer Level", IEEE Trans. on Magnetics, 2019, 55, 7, 5 pages.

Zhang et al., "L10-FePd Synthetic Antiferromagnet Through a Face-centered-cubic Ruthenium Spacer Utilized for Perpendicular Magnetic Tunnel Junctions", Physical Review Applied, vol. 9, Issue 4, Apr. 2018, 24 pages.

Qoutb et al., "Spintronic/CMOS-Based Thermal Sensors", IEEE ISCAS, 2020, 5 pages.

Weng et al., "A CMOS Thermistor-Embedded Continuous-Time Delta-Sigma Temperature Sensor With a Resolution FoM of 0.65 pJ C2", IEEE Journal of Solid-State Circuits, vol. 50, No. 11, Nov. 2015, 10 pages.

Choi et al., "A Compact Resistor-Based CMOS Temperature Sensor With an Inaccuracy of 0.12 ° C (3O') and a Resolution FoM of 0.43 pJ K2 in 65-nm CMOS", IEEE Journal of Solid-State Circuits, vol. 52, No. 12, Dec. 2018, 12 pages.

Sengupta, et al., "Magnetic Tunnel Junction as an On-Chip Temperature Sensor", Scientific Reports, Sep. 18, 2017, 8 pages.

Maciel et al., "Magnetic Tunnel Junction Applications", MDPI, Sensors, Dec. 24, 2019, 20 pages.

Shahmohammadi et al., "A Resistor-Based Temperature Sensor for MEMS Frequency References", IEEE, 2013, 4 pages.

Specification and Drawings in U.S. Appl. No. 17/469,227, filed Sep. 8, 2021, 27 pages.

\* cited by examiner

MAGNETIC FIELD SENSOR USING MAGNETIC TUNNELING JUNCTION (MTJ) STRUCTURES AND PASSIVE RESISTORS

FIELD OF THE INVENTION

The present disclosure relates to integrated circuits, and, more particularly, to a magnetic field sensor using magnetic tunneling junction (MTJ) structures and passive resistors, and methods of manufacture and operation.

BACKGROUND

In magnetic sensor technology, a Hall sensor can produce a Hall effect on a semiconductor. In particular, the Hall sensor is a device which can measure a magnitude of a magnetic field. An output voltage of the Hall sensor may be directly proportional to a magnetic field strength and can be used for proximity sensing, positioning, speed detection, and current sensing applications.

Anisotropic magneto-resistance (AMR) sensors measure changes in an angle of a magnetic field by using iron material. The resistance of the iron material in the AMR sensors depends on a direction of current flow and direction of magnetization. The AMR sensors can determine non-contact position measurements in harsh environments.

Giant magneto-resistance (GMR) sensors use quantum mechanics effects with a non-magnetic material between two iron material layers. Therefore, the GMR sensors result in high resistance for anti-parallel spin alignment and low resistance for parallel spin alignment when a current passes through one of the two iron material layers.

In comparison to the above type of sensors, tunnel magnetoresistance (TMR) sensors have magnetic tunneling junction (MTJ) elements which have resistance changes with a parallel alignment or an anti-parallel alignment. In current tunnel magnetoresistance (TMR) sensors using MTJ structures, four MTJ structures are required to form a Wheatstone bridge structure for magnetic field sensing. This requirement for four MTJ structures requires complex integration and etch schemes to develop different magnetic fixed layer designs since two of the MTJ structures must have opposite resistance characteristics in response to magnetic field changes than those of the other two MTJ structures. This also requires a special annealing process to orient magnetic fixed layers of the opposite type MTJ structures in different directions from one another.

SUMMARY

In an aspect of the disclosure, a structure comprises: a first portion of a circuit comprising a first magnetic tunneling junction (MTJ) structure and a first resistor coupled in series between a first voltage source and a second voltage source; and a second portion of the circuit comprising a second MTJ structure and a second resistor coupled in series between the first voltage source and the second voltage source, wherein the first portion and the second portion are coupled in parallel between the first voltage source and the second voltage source.

In another aspect of the disclosure, a structure comprises: a first resistor comprising a first end coupled to a first voltage source and a first magnetic tunneling junction (MTJ) structure, and a second end coupled to a second voltage source; and a second resistor comprising a first end coupled to the second voltage source and a second MTJ structure, and a second end coupled to the first voltage source.

In another aspect of the disclosure, a method comprises: forming a first portion of a circuit comprising a first magnetic tunneling junction (MTJ) structure and a first resistor coupled in series between a first voltage source and a second voltage source; and forming a second portion of the circuit comprising a second MTJ structure and a second resistor coupled in series between the first voltage source and the second voltage source, wherein the first portion and the second portion are coupled in parallel between the first voltage source and the second voltage source.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to integrated circuits, and, more particularly, to a magnetic field sensor using magnetic tunneling junction (MTJ) structures and passive resistors, and methods of manufacture and operation. More specifically, the present disclosure relates to a highly sensitive tunnel magnetoresistance sensor (TMR) which forms a Wheatstone bridge for field/position detection in integrated circuits. In embodiments, the TMR sensors comprise two MTJ structures and two passive resistors, e.g., polysilicon resistors, which form the Wheatstone bridge structure. In embodiments, the two MTJ structures are of the same type, with the same response to changes in a surrounding magnetic field, and the two passive resistors will have either no resistance change or a different response in electrical resistance to changes in the magnetic field than the MTJ structures. Advantageously, the structures described herein avoid topography and etch challenges that would occur with TMR sensors which require the use of different types of MTJ structures.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask.

Figure 1A:
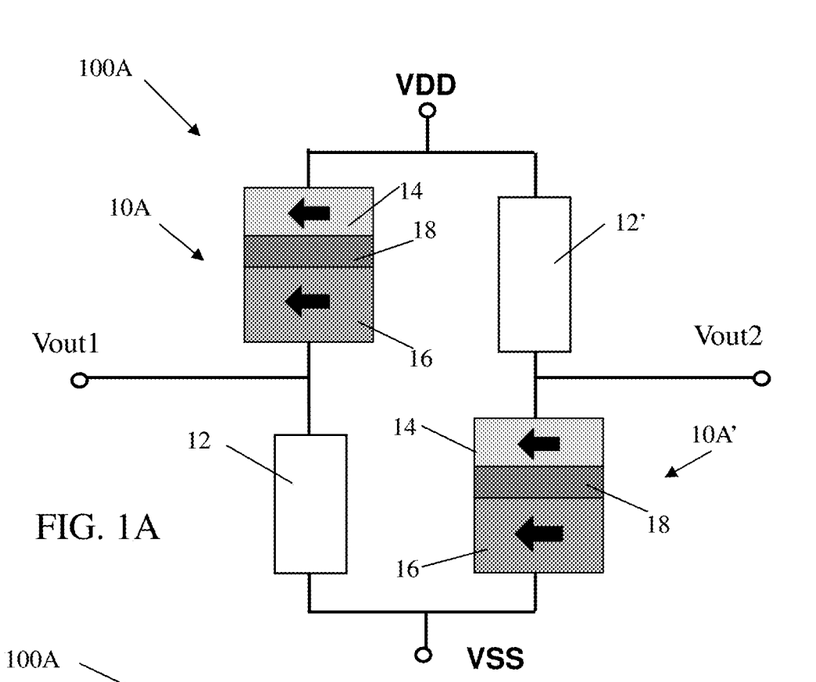
FIG. 1A shows a schematic of a Wheatstone bridge structure using magnetic tunneling junction (MTJ) structures in accordance with aspects of the present disclosure.

FIG. 1A shows a schematic of a Wheatstone bridge structure 100A. The Wheatstone bridge structure 100A includes a first MTJ structure 10A connected in series to a first power supply voltage VDD, and connected in series to a second power supply voltage VSS through a first resistor 12, e.g., a polysilicon resistor. A first voltage output terminal Vout1 is located between the first MTJ structure 10A and the first resistor 12. A second MTJ structure 10A' connects in series to the second power supply voltage VSS, and connects in series to the first power supply voltage VDD through a second resistor 12', e.g., a polysilicon resistor. A second voltage output terminal Vout2 is located between the second MTJ structure 10A' and the second resistor 12'. The first MTJ structure 10A and the first resistor 12 are connected in parallel with the second MTJ structure 10A' and the second resistor 12' between the first power supply voltage VDD and the second power supply voltage VSS.

In embodiments, the resistors 12, 12' are passive resistors (e.g., polysilicon resistors) which act as low state resistance (equivalent to parallel state resistance) along with the two MTJ structure 10A, 10A'. And, advantageously, the resistors 12, 12' do not need programming or extra annealing to place the two MTJ structures in a low resistance state. Moreover, as further described below, the MTJ structures may be MgO based tunnel magnetoresistance structures.

In FIG. 1A, the first and second MTJ structures 10A, 10A', as further described below, may be MgO based tunnel magnetoresistance structures. In embodiments, both the MTJ structures 10A, 10A' have in-plane fixed layers 16. The MTJ structures 10A, 10A' also each have in-plane free layers 14 and tunnel barrier layers 18. In accordance with aspects of the disclosure, the MTJ structures 10A, 10A' are the same type of MTJs structures, which operate in the same manner in response to the presence of a magnetic field. For example, the MTJ structures 10A, 10A' can both be Type 1 MTJ structures which will decrease in resistance as a surrounding magnetic field increases. Alternatively, the MTJ structures 10A, 10A' can both be Type 2 MTJ structures which will increase in resistance as a surrounding magnetic field increases. In either case, the MTJ structures 10A, 10A' are substantially identical to each other, thereby eliminating the need for matching different types of MTJ structures.

Still referring to FIG. 1A, the resistors 12, 12' are passive resistors which are substantially identical to one another, and which both have a stable dependence of resistance in response to temperature changes and changes in the surrounding magnetic field. For example, the resistors 12, 12' act as fixed low resistances in the Wheatstone bridge structure 100A that stay at a substantially constant resistance during changes in the magnetic field. The resistance value for the first and second resistors 12, 12' may be based on the resistance of the MTJ structures 10A, 10A' when there is zero magnetic field present. In alternative embodiments, other types of resistors could be used, such as diffused resistors, so long as both resistors are substantially identical to one another and both have a stable response to changes in magnetic field and temperature.

Still referring to FIG. 1A, in operation, the resistances of the MTJ structures 10A, 10A' and the first and second resistors 12, 12' are substantially the same in the presence of zero magnetic field, and, as such, the voltage output at the output terminals Vout1 and Vout2 will be substantially equal to one another. However, as a surrounding magnetic field increases, the resistances of the MTJ structures 10A, 10A' will switch in the same manner between low resistance (LR) and high resistance (HR) states. In other words, in response to an increasing magnetic field, the resistances of the MTJ structures 10A, 10A' correspondingly both decrease or both increase, depending upon the type of MTJ structure used, while the resistances of the first and second resistors 12, 12' remain substantially the same.

By virtue of the MTJ structure 10A being between the output terminal Vout1 and the voltage source VDD, while the MTJ structure 10A' may be between the output terminal Vout2 and the voltage source VSS, the voltage on one of the output terminals Vout1 and Vout2 will begin to increase with increasing magnetic field, while the voltage on the other one of the output terminals Vout1 and Vout2 will begin to decrease in response to the increasing magnetic field. As such, the voltage difference between the voltages on the output terminal Vout1 and the output terminal Vout2 provides a measure of the strength of the surrounding magnetic field. Further, this voltage difference may be substantially linear, so that the Wheatstone bridge structure 100A provides a substantially linear indication of changes in the magnetic field.

The above-described operation for measuring a surrounding magnetic field may be based on the resistances of the resistors 12, 12' remaining substantially constant during an increase in the surrounding magnetic field. However, in alternative embodiments, the resistors 12, 12' can also comprise a resistance variation in response to changes in the surrounding magnetic field, with the changes in resistance being substantially the same for each of the resistors 12, 12', and the changes in resistance being different than the changes in resistance of the MTJ structures 10A, 10A'. This may be the case since, as noted above, in order to generate different voltages at the output terminals Vout1 and Vout2, it may be necessary for the resistances of the resistors 12, 12' to change in a different manner than the resistances of the MTJ structures 10A, 10A'.

The MTJ structures 10A, 10A' may be structures based on magnetic tunnel junctions using MgO based tunnel magnetoresistance, having a tunneling magnetoresistance (TMR) of approximately 200%. An advantage of the Wheatstone bridge structure 100A of FIG. 1A is that it does not need four MTJ structures (of two different types) and, as such, decreases cost while still obtaining good magnetic sensitivity. In particular, by only using two MTJ structures of the same type, double processing steps to provide MTJ structures with different synthetic anti-ferromagnetic (SAF) structures may be not necessary, which significantly simplifies the manufacturing process. Regarding the magnetic sensitivity, it is noted that the sense margin for the Wheatstone bridge structure 100A of FIG. 1A is 2-3 orders better than that of conventional Hall sensors.

Figure 1B:
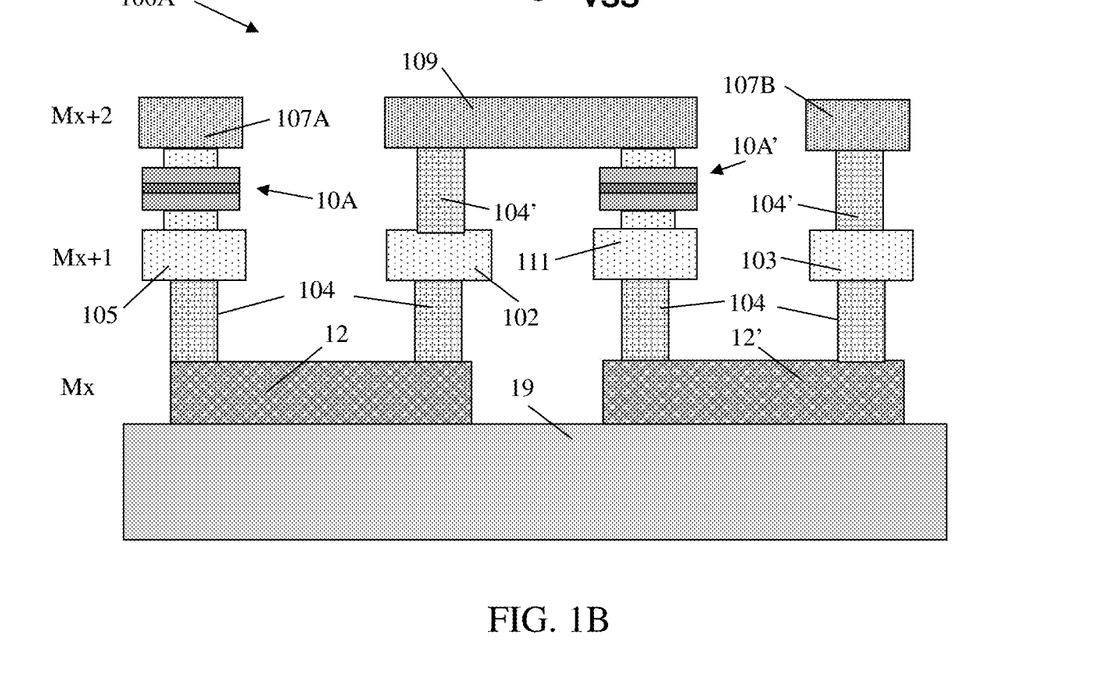
FIG. 1B shows the Wheatstone bridge structure of the schematic of FIG. 1A, and respective fabrication processes in accordance with aspects of the present disclosure.

In FIG. 1B, the Wheatstone bridge structure 100A, shown schematically in FIG. 1A, includes different levels Mx, Mx+1 and Mx+2, with the MTJ structures 10A, 10A' both between levels Mx+1 and level Mx+2. In embodiments, the levels Mx, Mx+1 and Mx+2 are connected by interconnect structures 104, 104'. Accordingly, as shown in FIG. 1B, the two MTJ structures 10A, 10A' are provided on the same level, connected to the resistors 12, 12' through interconnect structures 104.

More particularly, as shown in FIG. 1B, the resistors 12, 12' are formed, using conventional polycrystalline silicon deposition techniques, as polycrystalline silicon resistor layers on a shallow trench insulation (STI) structure 19 formed on a semiconductor substrate. A first end of the polysilicon resistor 12 may be coupled, via the interconnect layer 104, to a first output terminal 105 (corresponding to the first voltage output terminal Vout1 of FIG. 1A). The first output terminal 105 is, in turn, coupled to a first power supply terminal 107A, which provides the first power supply voltage VDD shown in FIG. 1A, via the MTJ structure 10A. A second end of the polysilicon resistor 12 may be coupled to the second power supply terminal 109, which provides the second power supply voltage VSS shown in FIG. 1A, on the level Mx+2, via interconnect layers 104 and 104' and a first metal layer 102 on the level Mx+1.

Still referring to FIG. 1B, a first end of the resistor 12' may be coupled, via the interconnect layer 104, to the output terminal 111 (corresponding to the second voltage output terminal Vout2 of FIG. 1A). The second output terminal 111 is, in turn, coupled to the power supply terminal 109 via the MTJ structure 10A'. A second end of the resistor 12' may be coupled to a first voltage terminal 107B, which also supplies the first power supply voltage VDD, on the level Mx+2, via interconnect layers 104 and 104', and a second metal layer 103 on the level Mx+1.

Still referring to FIG. 1B, the various interconnect layers 104 and 104', the first and second metal layers 102 and 103, the first and second output terminals 105 and 111, and the first and second power supply terminal 107A, 107B and 109, are formed of conductive material, e.g., metal or metal alloys, formed by known metallization techniques for sequentially forming metal layers, metal contacts, and metal interconnect structures to interconnect the elements formed on the substrate, such as the resistors 12, 12', to other circuit elements and to external power supply sources. The MTJ structures 10A, 10B can also be formed using known metallization techniques as described in more detail with respect to FIGS. 5A, 5B and 5.

For example, each of the metal layers may be formed by conventional, lithography, etching and deposition methods known to those of skill in the art. For example, each of the metal layers may be formed in a trench of an insulator material, e.g., using a resist formed over an upper portion of the insulator material followed by exposure to energy (light) to form a pattern (opening) and an etching process with a selective chemistry, e.g., reactive ion etching (RIE), to form a trench. Following trench formation, the resist can be removed by oxygen ashing or other known stripants. An appropriate metal material may then be deposited within the trench using conventional deposition processes, e.g., chemical vapor deposition (CVD), plasma enhanced CVD (PECVD), etc. Any excessive material on the upper surface of the insulator material can be removed by a conventional chemical mechanical planarization (CMP) process.

Figure 2:
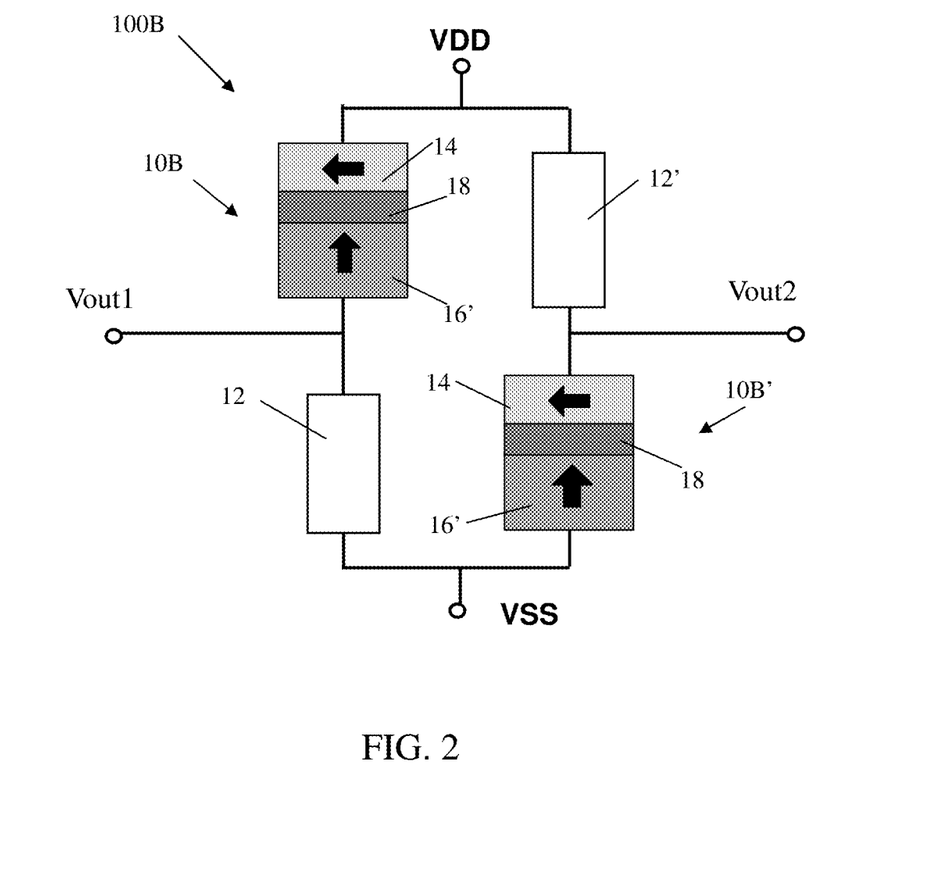
FIG. 2 shows a schematic of a Wheatstone bridge structure using MTJ structures in accordance with alternative aspects of the present disclosure.

FIG. 2 shows a schematic of a Wheatstone bridge structure 100B in accordance with an alternative aspect of the present disclosure. The Wheatstone bridge structure 100B may be substantially similar to the Wheatstone bridge structure 100A shown in FIG. 1A, except that the MTJ structures of FIG. 2 are a first MTJ structure 10B and a second MTJ structure 10B' comprising perpendicular fixed layers 16', instead of the in-plane fixed layers 16 of MTJ structures 10A, 10A' of FIG. 1A. The MTJ structures 10B and 10B', similar to the MTJ structures 10A, 10A' of FIG. 1A, have in-plane free layers 14 and tunnel barrier layers 18. Other than the use of perpendicular fixed layers 16', the structure and operation of the Wheatstone bridge structure 100B shown in FIG. 2 may be substantially the same as that shown and described above with regard to the Wheatstone bridge structure 100A of FIGS. 1A and 1B. It is also noted that, although both FIGS. 1A and 2 show the MTJ structures using in-plane free layers 14, perpendicular free layers may also be used herein.

Figure 3:
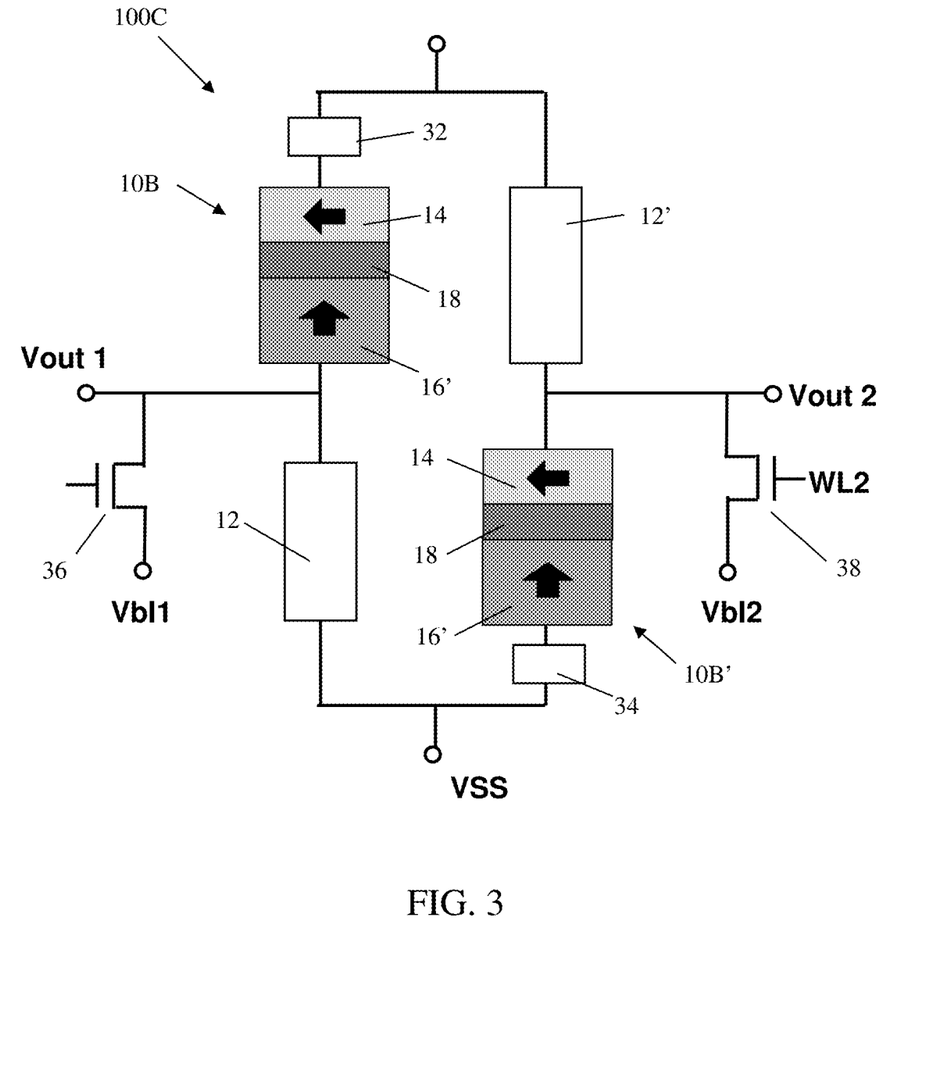
FIG. 3 shows a Wheatstone bridge structure using MTJ structures in accordance with alternative aspects of the present disclosure.

FIG. 3 shows a schematic of a Wheatstone bridge structure 100C in accordance with another alternative aspect of the present disclosure. The Wheatstone bridge structure 100C may be substantially similar to the Wheatstone bridge structure 100B shown in FIG. 2, using a first MTJ structure 10B and a second MTJ structure 10B', using perpendicular fixed layers 16'. It should be understood, though, as an alternative, the first and second MTJ structures can have parallel fixed layers 16 as shown in FIG. 1A, for example. In comparison to the Wheatstone bridge structures 100A and 110B, of FIGS. 1A and 2, the Wheatstone bridge structure 100C of FIG. 3 includes a first tuning resistor 32, e.g., a polysilicon resistor, a second tuning resistor 34, e.g., a polysilicon resistor, a first switching transistor 36 and a second switching transistor 38.

Still referring to FIG. 3, the switching transistors 36, 38 are connected to the first and second output terminals Vout1, Vout2, respectively, and are programmed to periodically switch the MTJ structures 10B and 10B' from a high resistance state (HR) and a low resistance state (LR). In accordance with an aspect of the present disclosure, the MTJ structures 10B and 10B' may be cyclically switched from their HR state to their LR state by the switching transistors 36, 38, respectively, and operate to detect the surrounding magnetic field at each cycle, in the manner described above for providing different outputs from the first and second output terminals Vout1 and Vout2 to measure the magnetic field, after being switched to the LR state. Alternatively, an external magnetic field can be applied to the MTJ structures 10B, 10B' to switch the MTJ structures into their LR states to operate to detect the surrounding magnetic field at each cycle. It is also noted that, although FIG. 3 shows the use of MTJ structures 10B, 10B' corresponding to FIG. 2, the switching transistors 36, 38 can also be used in conjunction with the MTJ structures 10A, 10A' shown in FIG. 1A to perform the cyclical switching operation described above for detecting the surrounding magnetic field at each cycle after being switched to a LR state.

Still referring to FIG. 3, the first tuning resistor 32 may be coupled between the free layer 14 of the first MTJ structure 10B and the first voltage source VDD, and the tuning resistor 34 may be coupled between the fixed layer 16' of the MTJ structure 10B' and the voltage source VSS. More specifically, the resistor 32 is provided in series to the MTJ structure 10B and resistor 12; whereas the resistor 34 is provided in series to the MTJ structure 10B' and resistor 12'. In this way, resistance can be tuned to minimize offset for targeted applications.

In operation, the tuning resistors 32, 34 are provided to compensate for any mismatch in the resistance characteristics of the first and second MTJ structures 10B, 10B', so that the resistance of the Wheatstone bridge structure 100C can be tuned to minimize offset for targeted applications. If desired, this tuning can be provided during the manufacturing process.

Figure 4:
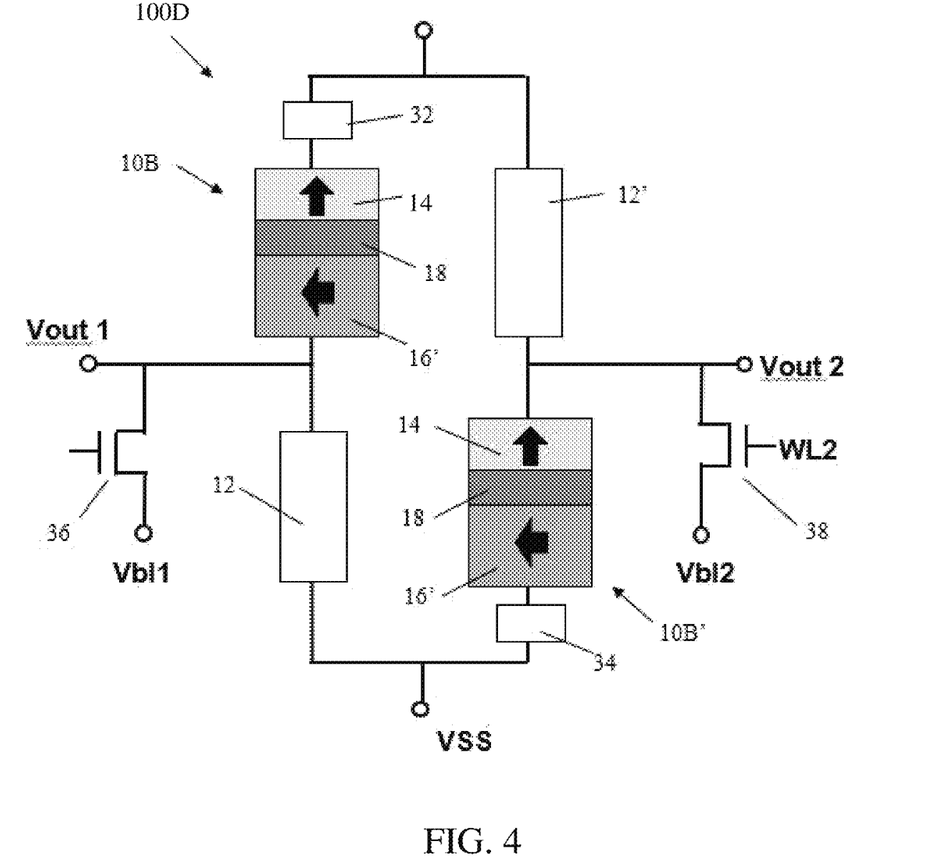
FIG. 4 shows a Wheatstone bridge structure using MTJ structures in accordance with additional aspects of the present disclosure.

FIG. 4 shows a Wheatstone bridge structure using MTJ structures in accordance with additional aspects of the present disclosure. The Wheatstone bridge structure 100D may be substantially similar to the Wheatstone bridge structure 100C shown in FIG. 3, using an MTJ structure 10B and an MTJ structure 10B'. In comparison to the Wheatstone bridge structure 100C of FIG. 3, the Wheatstone bridge structure 100D of FIG. 4 includes an in-plane reference layer 16' and perpendicular free layer 14. The remaining features are similar to that shown in FIG. 3, for example.

Figure 5A:
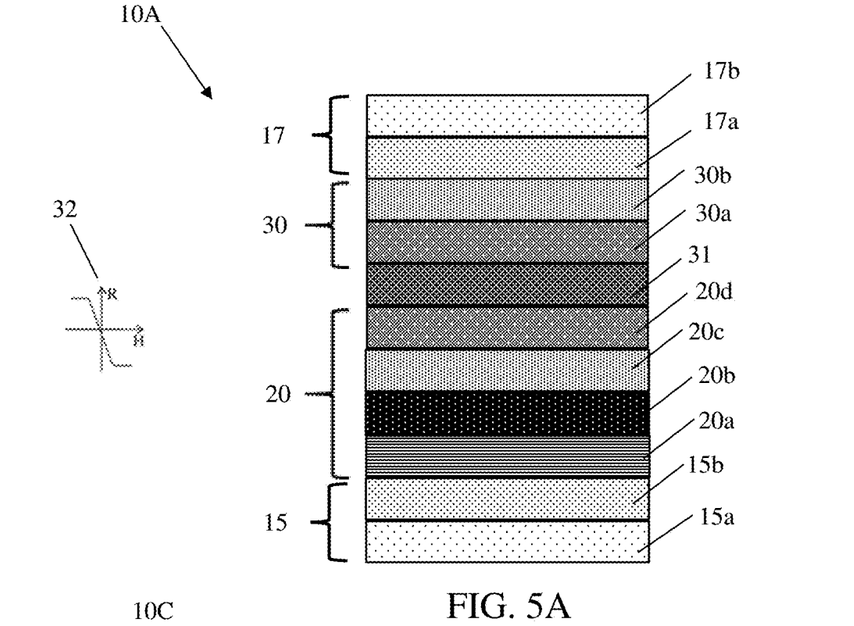
FIG. 5A shows a first MTJ structure and respective fabrication processes in accordance with aspects of the present disclosure.

FIG. 5A shows a magnetic tunneling junction (MTJ) structure which may be used for the MTJ structure 10A (and the substantially identical MTJ structure 10A') of FIG. 1A. In particular, FIG. 5A shows an MTJ structure which has an in-plane free layer and an in-plane fixed layer, and which will decrease in resistance as a surrounding magnetic field increases.

In FIG. 5A, the MTJ structure 10A includes buffer layer 15, cap layer 17, a bi-layer of ferromagnetic material 20, and a sensing layer 30 (corresponding to the free layer 14 of FIG. 1A). The bi-layer of ferromagnetic material 20 (corresponding to the fixed layer 16 of FIG. 1A) comprises a synthetic anti-ferromagnetic (SAF) stack of materials between the buffer layer 15 and material 31 (corresponding to the tunnel barrier layer 18 of FIG. 1A); whereas, the sensing layer 30 may be between the material 31 and the cap layer 17. The material 31 comprises Magnesium Oxide (MgO); although other materials are also contemplated.

The buffer layer 15 of the MTJ element 10A includes material 15b on top of and in direct contact with material 15a. Similarly, the cap layer 17 includes material 17b on top of and in direct contact with material 17a. In embodiments, materials 15a, 17a comprise tantalum (Ta) and materials 15b, 17b comprise Ruthenium (Ru); although other materials are also contemplated.

The bilayer of ferromagnetic material stack 20 includes materials 20a, 20b, 20c, and 20d, stacked in sequential order directly on top of and in contact with one another. In embodiments, for example, material 20a comprises Platinum Manganese (PtMn), material 20b comprises Cobalt Iron (CoFe), material 20c comprises Ruthenium (Ru), and material 20d comprises Cobalt Iron Boron Tantalum (CoFeBTa); although other materials are also contemplated herein. In particular, the material 20d can include any combination of Cobalt Iron, Cobalt Iron Boron, Tantalum, Molybdenum, Tungsten, Titanium, Zirconium, Hafnium, and Chromium. The bilayer of the ferromagnetic material stack 20 refers to materials 20b and 20d, which can be magnetized under a magnetic field.

The sensing layer 30 includes material 30b on top of and in direct contact with material 30a. Further, the material 30a may be on top of and in direct contact with the material 31. In embodiments, the material 30a comprises Cobalt Iron Boron Tantalum (CoFeBTa) and the material 30b comprises Nickel Iron (NiFe); although other materials are also contemplated herein. In addition, any combination of Tantalum, Molybdenum, Tungsten, Titanium, Zirconium, Hafnium, and Chromium can be included between the material 30a and the material 30b. The material 30a can also include any combination of Tantalum, Molybdenum, Tungsten, Titanium, Zirconium, Hafnium, and Chromium.

Figure 5B:
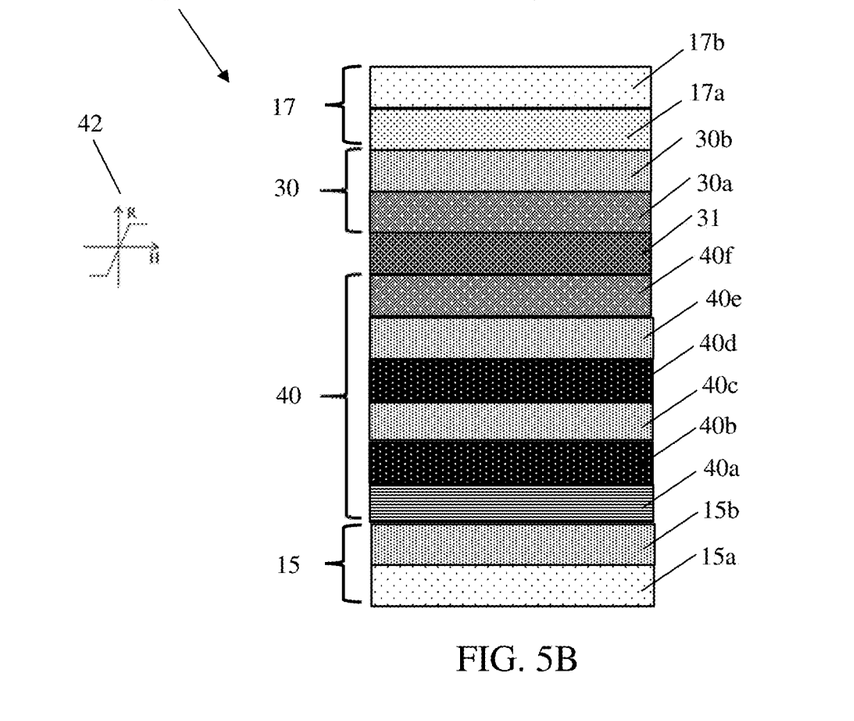
FIG. 5B shows a second MTJ structure and respective fabrication processes in accordance with aspects of the present disclosure.

FIG. 5B shows another magnetic tunneling junction (MTJ) structure 10C, which has an in-plane free layer and an in-plane fixed layer, which will increase in resistance in response to an increase in a magnetic field. The MTJ structure 10C may be used as an alternative to the MTJ structures 10A, 10A' shown in FIG. 1A. In other words, the Wheatstone bridge 100A may be constructed using a pair of the MTJ structures 10C so that the Wheatstone bridge will operate with the pair of MTJs 10C increasing in resistance in response to an increase in magnetic field, instead of decreasing in resistance like the MTJ structures 10A, 10A' do. This alternative MTJ structure 10C includes buffer layer 15, cap layer 17, a sensing layer 30, and a tri-layer ferromagnetic stack 40. The buffer layer 15 of the MTJ element 10A includes material 15b on top of and in direct contact with material 15a. Further, the cap layer 16 includes material 17b on top of and in direct contact with material 17a. In embodiments, materials 15a, 17a comprise tantalum (Ta) and material 15b, 17b comprise Ruthenium (Ru); although other materials are also contemplated herein.

The tri-layer ferromagnetic stack 40 comprises a synthetic anti-ferromagnetic (SAF) stack of materials located between the buffer layer 15 and material 31. The sensing layer 30 may be between the material 31 and the cap layer 17. The material 31 can include Magnesium Oxide (MgO); although other materials are also contemplated.

The tri-layer SAF stack 40 includes layers of materials 40a, 40b, 40c, 40d, 40e, and 40f, stacked in sequential order directly on top and in contact with one another. In embodiments, for example, material 40a comprises Platinum Manganese (PtMn), material 40b comprises Cobalt Iron (CoFe), material 40c comprises Ruthenium (Ru), material 40d comprises Cobalt Iron (CoFe), material 40e comprises Ruthenium (Ru), and material 40f comprises Cobalt Iron Boron Tantalum (CoFeBTa); although other materials are also contemplated. The tri-layer of the ferromagnetic stack 40 refers to materials 40b, 40d and 40f, which can be magnetized under a magnetic field. Further, the material 40d can also comprise Cobalt Iron Boron (CoFeB) or a multilayer of Cobalt Iron (CoFe) and Cobalt Iron Boron (CoFeB). The material 40f can also include any combination of Cobalt Iron, Cobalt Iron Boron, Tantalum, Molybdenum, Tungsten, Titanium, Zirconium, Hafnium, and Chromium.

The sensing layer 30 includes material 30b on top of and in direct contact with material 30a. In embodiments, the material 30a comprises Cobalt Iron Boron Tantalum (CoFeBTa) and the material 30b comprises Nickel Iron (NiFe); although other materials are also contemplated herein. In addition, any combination of Tantalum, Molybdenum, Tungsten, Titanium, Zirconium, Hafnium, and Chromium can be included between the material 30a and the material 30b. The material 30a can also include any combination of Tantalum, Molybdenum, Tungsten, Titanium, Zirconium, Hafnium, and Chromium. Further, the layer 30a may be on top of and in direct contact with the layer 31.

Still referring to FIGS. 5A and 5B, characteristic graphs 32 and 42 are also shown in FIGS. 5A and 5B. The characteristic graph 32 of the MTJ element 10A of FIG. 5A shows that the electrical resistance R decreases (i.e., electrical resistance R in the Y-axis) as the magnetic field H increases (i.e., magnetic field H in the X-axis). In comparison, the characteristic graph 42 of the alternative MTJ structure 10C of FIG. 5B shows that the electrical resistance R increases (i.e., electrical resistance R in the Y-axis) as the magnetic field H increases (i.e., magnetic field H in the X-axis).

Figure 6:
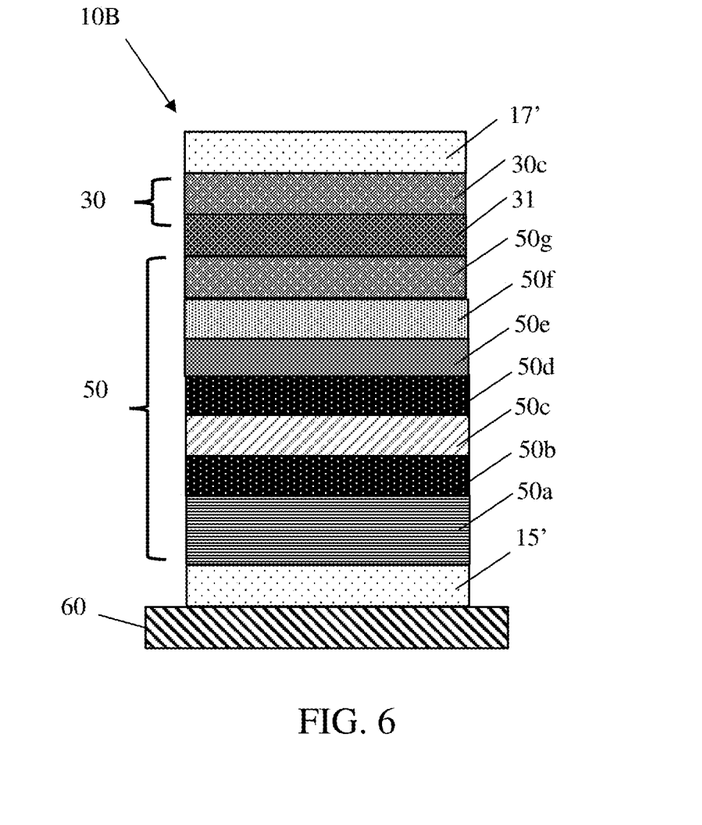
FIG. 6 shows a third MTJ structure, and respective fabrication processes, in accordance with aspects of the present disclosure.

FIG. 6 shows a magnetic tunneling junction (MTJ) structure 10B, such as used in FIGS. 2 and 3, which has an in-plane free layer and a perpendicular fixed layer. In particular, in FIG. 6, the MTJ structure 10B includes buffer layer 15', cap layer 17', a p-SAF pinned layer of ferromagnetic material 50, and a sensing layer 30 (corresponding to the free layer 14 of FIGS. 2 and 3). The p-SAF pinned layer of ferromagnetic material 50 (corresponding to the fixed layer 16' of FIGS. 2 and 3) comprises a synthetic anti-ferromagnetic (SAF) stack of materials between the buffer layer 15' and material 31 (corresponding to the tunnel barrier layer 18 of FIGS. 2 and 3); whereas the sensing layer 30 may be a material 30c between the material 31 and the cap layer 17'. The material 31 comprises Magnesium Oxide (MgO); although other materials are also contemplated.

The buffer layer 15' of the MTJ element 10B includes material which may comprise tantalum (Ta), Ruthenium (Ru) and/or Platinum (Pt); although other materials are also contemplated. The cap layer 17' may comprise tantalum (Ta) and/or Ruthenium (Ru); although other materials are also contemplated. The p-SAF pinned layer of ferromagnetic material stack 50 includes materials 50a, 50b, 50c, 50d, 50e, 50f and 50g stacked in sequential order on a substrate 60, which may be comprised of a semiconductor material, e.g., silicon, or an insulator material, e.g., $SiO_2$, directly on top of and in contact with one another. In embodiments, for example, material 50a may comprise Cobalt/Platinum, material 50b may comprise Cobalt, material 50c may comprise Ruthenium, material 50d may comprise Cobalt, material 50e may comprise Platinum/Cobalt, material 50f may comprise Tantalum and material 50g may comprise Cobalt Iron Boron. In embodiments, the material 50g may include any combination of Cobalt Iron, Cobalt Iron Boron, Tantalum, Molybdenum, Tungsten, Titanium, Zirconium, Hafnium, and Chromium. The bilayer of the ferromagnetic material stack 50 refers to materials 50g which can be magnetized under a magnetic field. The sensing layer 30 includes material 30c as a free layer which may comprise Cobalt Iron Boron (CoFeB). In addition, any combination of Tantalum, Molybdenum, Tungsten, Titanium, Zirconium, Hafnium, and Chromium may be included in the material 30c.

The MTJ structures 10A, 10B and 10C shown in FIGS. 5A, 5B and 6 can be formed by conventional deposition, lithography, and etching methods known to those of skill in the art. For example, each of the layers of material in each of the structures 10A, 10B and 10C can be deposited by a conventional deposition method such as a physical vapor deposition (PVD) and a chemical vapor deposition (CVD) process. Following the deposition processes, a resist formed over a topmost material, e.g., layer 15b', may be exposed to energy (light) to form a pattern (opening). An etching process with a selective chemistry, e.g., reactive ion etching (RIE), will be used to pattern the materials through the openings of the resist to form the respective MTJ structures 10A, 10B and 10C. The resist can be removed by a conventional oxygen ashing process or other known stripants.

A tunnel magnetoresistance sensor (TMR) in accordance with the present disclosure can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as Smartphones) and edge computing markets. SoC is also used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a first portion of a circuit comprising a first magnetic tunneling junction (MTJ) structure and a first resistor coupled in series between a first voltage source and a second voltage source;
   a second portion of the circuit comprising a second MTJ structure and a second resistor coupled in series between the first voltage source and the second voltage source;
   a third resistor in series with the first MTJ structure, the first resistor and the first voltage source and a fourth resistor in series with the second MTJ structure, the second resistor and the second voltage source; and
   a first switching transistor coupled to the first output terminal and a second switching transistor coupled to the second output terminal,
   wherein the first portion and the second portion are coupled in parallel between the first voltage source and the second voltage source, and
   the first portion of the circuit and the second portion of the circuit comprise a Wheatstone bridge, the first switching transistor and the second switching transistor being configured to switch the first MTJ structure and the second MTJ structure between a low resistance state and a high resistance state, and the third resistor and the fourth resistor being configured to tune the first portion of the circuit and the second portion of the circuit to compensate for mismatches between the first MTJ structure and the second MTJ structure in the Wheatstone bridge.

2. The structure of claim 1, further comprising a first output terminal in the first portion of the circuit between the first MTJ structure and the first resistor, and a second output terminal in the second portion of the circuit between the second MTJ structure and the second resistor.

3. The structure of claim 1, wherein the first MTJ structure and the second MTJ structure each include an in-plane free layer and an in-plane fixed layer, and each comprise substantially same operating characteristics.

4. The structure of claim 3, wherein the first resistor and the second resistor comprise polysilicon resistors.

5. The structure of claim 1, wherein the first MTJ structure and the second MTJ structure each include an in-plane free layer and a perpendicular fixed layer.

6. The structure of claim 5, wherein the first resistor and the second resistor are polysilicon resistors.

7. The structure of claim 5, wherein the third resistor is between the first MTJ structure and the first voltage source, and the fourth resistor is between the second MTJ structure and the second voltage source.

8. A structure comprising:
a first resistor comprising a first end coupled to a first voltage source and a first magnetic tunneling junction (MTJ) structure, and a second end coupled to a second voltage source;
a second resistor comprising a first end coupled to the second voltage source and a second MTJ structure, and a second end coupled to the first voltage source; and
a first output terminal coupled between the first end of the first resistor and the first MTJ structure, and a second output terminal coupled between the first end of the second resistor and the second MTJ structure; and
a third resistor coupled in series between the first MTJ structure and the first voltage source; and
a fourth resistor coupled in series between the second MTJ structure and the second voltage source, thereby forming a first circuit comprised of the first resistor, wherein the first MTJ structure and the third resistor coupled in series between the first voltage source and the second voltage source, and a second circuit, parallel to the first circuit, and comprising the second resistor, the second MTJ structure and the third resistor coupled in series between the first voltage source and the second voltage source.

9. The structure of claim 8, wherein the first MTJ structure and second MTJ structure each have a lower electrical resistance in response to an increased magnetic field.

10. The structure of claim 8, wherein the first resistor and the second resistor comprise polysilicon resistors.

11. The structure of claim 8, wherein the first MTJ structure and the second MTJ structure each have a higher electrical resistance in response to an increased magnetic field.

12. The structure of claim 8, wherein the first resistor, the second resistor, the first MTJ structure and the second MTJ structure comprise a Wheatstone bridge.

13. A method comprising:
forming a first portion of a circuit comprising a first magnetic tunneling junction (MTJ) structure and a first resistor coupled in series between a first voltage source and a second voltage source;
forming a second portion of the circuit comprising a second MTJ structure and a second resistor coupled in series between the first voltage source and the second voltage source,
forming third resistor in series with the first MTJ structure, the first resistor and the first voltage source, and a fourth resistor in series with the second MTJ structure, the second resistor and the second voltage source; and
forming a first switching transistor coupled to the first output terminal and a second switching transistor coupled to the second output terminal,
wherein the first portion and the second portion are coupled in parallel between the first voltage source and the second voltage source, and
wherein the first portion of the circuit and the second portion of the circuit comprise a Wheatstone bridge, the first switching transistor and the second switching transistor being configured to switch the first MTJ structure and the second MTJ structure between a low resistance state and a high resistance state, and the third resistor and the fourth resistor being configured to tune the first portion of the circuit and the second portion of the circuit to compensate for mismatches between the first MTJ structure and the second MTJ structure in the Wheatstone bridge.

* * * * *